US012663730B2

(12) United States Patent
Best et al.

(10) Patent No.: US 12,663,730 B2
(45) Date of Patent: Jun. 23, 2026

(54) FRONT-TO-BACK OVERLAY (FTBO) STANDARD

(71) Applicant: Onto Innovation Inc., Wilmington, MA (US)

(72) Inventors: Keith F. Best, Andover, MA (US); Corey Robert Shay, Amherst, NH (US); Jyr Hong Soo, Princeton, NJ (US)

(73) Assignee: Onto Innovation Inc., Wilmington, MA (US)

( * ) Notice: Subject to any disclaimer, the term of this patent is extended or adjusted under 35 U.S.C. 154(b) by 60 days.

(21) Appl. No.: 18/629,615

(22) Filed: Apr. 8, 2024

(65) Prior Publication Data

US 2025/0314974 A1 Oct. 9, 2025

(51) Int. Cl.
*G03F 7/00* (2006.01)

(52) U.S. Cl.
CPC .... *G03F 7/706845* (2023.05); *G03F 7/70633* (2013.01); *G03F 7/70683* (2013.01); *G03F 7/706839* (2023.05)

(58) Field of Classification Search
CPC .......... G03F 7/706845; G03F 7/70516; G03F 7/70633; G03F 9/7019
See application file for complete search history.

(56) References Cited

U.S. PATENT DOCUMENTS

| | | | |
|---|---|---|---|
| 6,340,547 B1 | 1/2002 | Chen et al. | |
| 6,372,395 B2 | 4/2002 | Kawakubo et al. | |
| 6,861,186 B1 | 3/2005 | Pagette et al. | |
| 6,897,075 B2 | 5/2005 | Bode et al. | |
| 7,111,256 B2 | 9/2006 | Seligson et al. | |
| 7,271,905 B2 | 9/2007 | Smith et al. | |
| 7,468,795 B2 | 12/2008 | Simons et al. | |
| 8,039,181 B2 | 10/2011 | Seltmann et al. | |
| 8,994,916 B2 | 3/2015 | Mei et al. | |
| 9,395,633 B2 | 7/2016 | Danilin et al. | |
| 9,958,790 B2 | 5/2018 | Nooitgedagt et al. | |

(Continued)

FOREIGN PATENT DOCUMENTS

| | | |
|---|---|---|
| CN | 110554581 | 12/2019 |
| CN | 112684679 | 4/2021 |

(Continued)

OTHER PUBLICATIONS

"International Application Serial No. PCT US2025 020383, International Search Report mailed Jun. 27, 2025", 4 pages.

(Continued)

*Primary Examiner* — Steven H Whitesell
(74) *Attorney, Agent, or Firm* — Schwegman Lundberg & Woessner, P.A.

(57) ABSTRACT

Various examples herein describe an apparatus and related method to calibrate two in-line lithographic tools used as part of in-line, panel-production equipment. The two lithographic tools are used to expose opposing sides of a panel or substrate, such as, for example, an Advanced Integrated Circuit Substrates (AICS) panel or another type of panel or substrate, such as a copper-clad laminate (CCL) panel). The panel may be, for example, a flat-panel display or another substrate type. Other systems, apparatuses, and methods are also disclosed.

20 Claims, 5 Drawing Sheets

(56)                References Cited

U.S. PATENT DOCUMENTS

| | | | | |
|---|---|---|---|---|
| 11,042,099 | B2 | 6/2021 | Zhou et al. | |
| 11,709,434 | B2 | 7/2023 | Rahman et al. | |
| 2002/0024642 | A1 | 2/2002 | Zemel | |
| 2003/0223630 | A1* | 12/2003 | Adel | G03F 9/7011 382/145 |
| 2004/0126004 | A1* | 7/2004 | Kikuchi | G03F 9/7003 382/141 |
| 2006/0292463 | A1* | 12/2006 | Best | G03F 9/7084 430/311 |
| 2007/0072091 | A1* | 3/2007 | Smith | G03F 1/44 430/30 |
| 2008/0239277 | A1* | 10/2008 | Cramer | G03F 7/70516 355/77 |
| 2012/0008127 | A1* | 1/2012 | Tel | G06T 7/80 355/77 |
| 2014/0168620 | A1* | 6/2014 | Schmitt-Weaver | G03F 7/70516 355/52 |
| 2015/0170904 | A1 | 6/2015 | Tsen et al. | |
| 2018/0173118 | A1* | 6/2018 | Schmitt-Weaver | G03F 9/7019 |
| 2019/0258179 | A1 | 8/2019 | Hu et al. | |
| 2020/0058509 | A1 | 2/2020 | Devilliers | |
| 2020/0363738 | A1 | 11/2020 | Shibazaki | |
| 2022/0163894 | A1 | 5/2022 | Mei et al. | |
| 2023/0108481 | A1 | 4/2023 | Ten et al. | |

FOREIGN PATENT DOCUMENTS

| | | |
|---|---|---|
| KR | 101700036 | 1/2017 |
| WO | 2025216855 | 10/2025 |

OTHER PUBLICATIONS

"International Application Serial No. PCT US2025 020383, Written Opinion mailed Jun. 27, 2025", 3 pages.

* cited by examiner

210

203　203　203　205　203　203

201
205

203

203

205

203

203　203　203

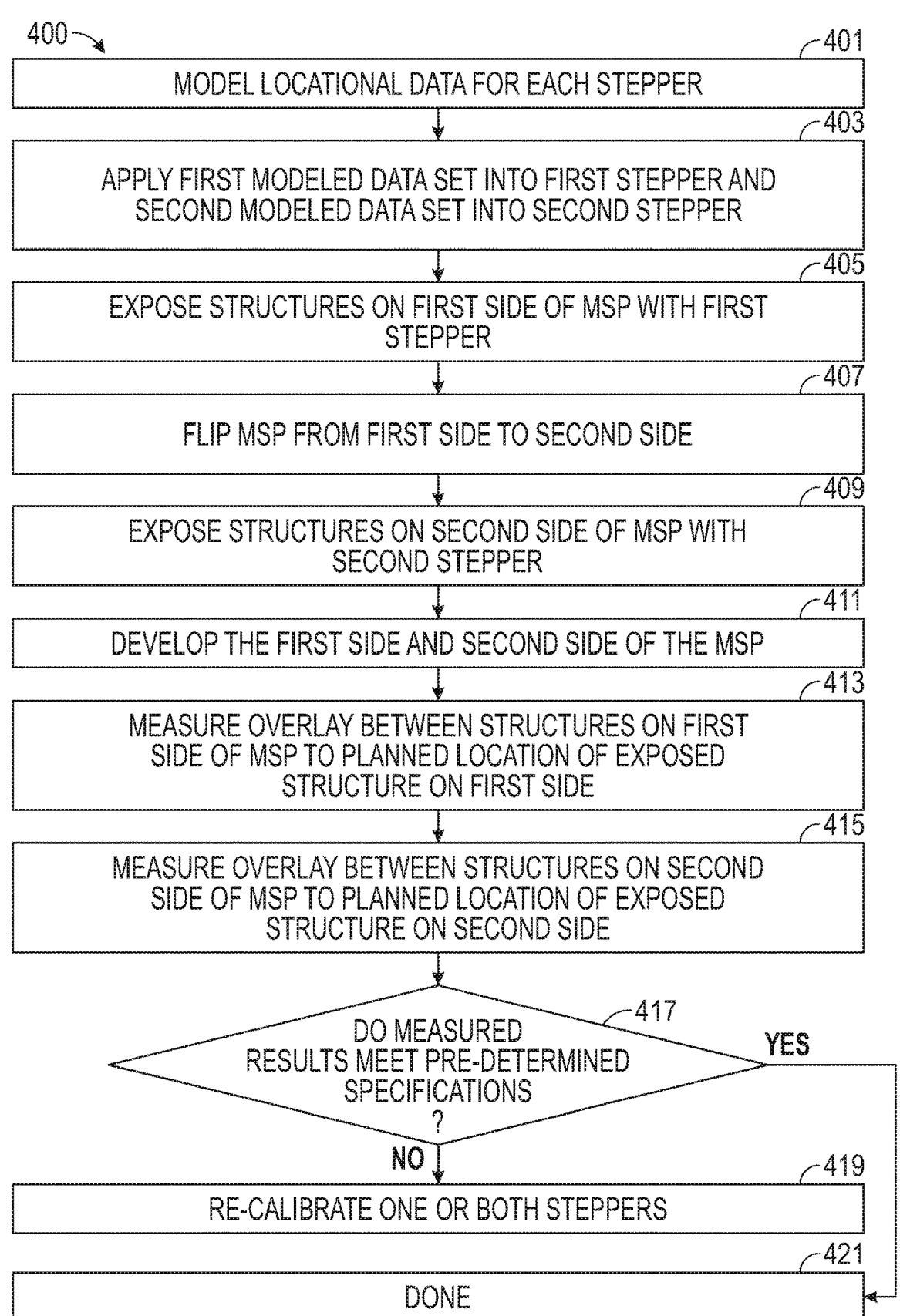

400

401
MODEL LOCATIONAL DATA FOR EACH STEPPER

403
APPLY FIRST MODELED DATA SET INTO FIRST STEPPER AND SECOND MODELED DATA SET INTO SECOND STEPPER

405
EXPOSE STRUCTURES ON FIRST SIDE OF MSP WITH FIRST STEPPER

407
FLIP MSP FROM FIRST SIDE TO SECOND SIDE

409
EXPOSE STRUCTURES ON SECOND SIDE OF MSP WITH SECOND STEPPER

411
DEVELOP THE FIRST SIDE AND SECOND SIDE OF THE MSP

413
MEASURE OVERLAY BETWEEN STRUCTURES ON FIRST SIDE OF MSP TO PLANNED LOCATION OF EXPOSED STRUCTURE ON FIRST SIDE

415
MEASURE OVERLAY BETWEEN STRUCTURES ON SECOND SIDE OF MSP TO PLANNED LOCATION OF EXPOSED STRUCTURE ON SECOND SIDE

417
DO MEASURED RESULTS MEET PRE-DETERMINED SPECIFICATIONS ?

YES

NO

419
RE-CALIBRATE ONE OR BOTH STEPPERS

421
DONE

FIG. 4

FRONT-TO-BACK OVERLAY (FTBO) STANDARD

TECHNOLOGY FIELD

The disclosed subject-matter is related generally to the field of calibrating lithographic equipment used in fabrication or manufacturing facilities. More specifically, in various embodiments, the disclosed subject-matter relates to minimizing an overlay error of one or more lithographic equipment tools.

BACKGROUND

Manufacturing production lines for Advanced Integrated Circuit Substrates (AICS) are configured to have two in-line lithographic equipment tools (e.g., including photolithographic steppers (steppers), scanners, or direct write lithography (maskless lithography)). As is readily understood by a person of ordinary skill in the art, a "tool," as used herein, may refer to various types of equipment. The first lithographic tool patterns a first side of the substrate (e.g., the "A" or front side of the substrate). The second lithographic tool patterns an opposite side (e.g., the "B" or back side of the substrate). However, there is currently no means to correlate or calibrate the first and second lithographic tools such that features exposed on the "A" side align with exposed features on the "B" side of the substrate.

SUMMARY

This document describes, among other things, a substrate (e.g., a glass-panel substrate), having a thickness substantially equivalent to a standard-production panel (e.g., the AICS substrate or other type of panel such as a copper-clad laminate (CCL) panel), that is patterned with holes formed through the substrate. In various embodiments, the holes may be laser-drilled holes or holes formed from a first side of the substrate to an opposing side of the substrate. Consequently, the holes are completely formed through the substrate such that the pattern on side "A" is substantially the same as and aligned with the pattern on side "B." The substrate is used to calibrate each of the lithographic tools used to produce a substrate on the opposing "A" side and "B" side.

In various embodiments, the disclosed subject-matter is a method for calibrating two in-line lithographic tools having a substrate flipper unit located therebetween, the method including subsequently placing a metrology-standard panel (MSP) in each of the two lithographic tools; mapping locations of patterned holes of the MSP to locations as determined by a first lithographic tool and a second lithographic tool, respectively, to produce a first set of locational data and a second set of locational data; forming a film on both a first side and a second side of the MSP; exposing portions of the first side of the MSP in the first lithographic tool and the second side of the MSP in the second lithographic tool, respectively; measuring an overlay error for each of the first side and the second side between the patterned holes on the MSP to the exposed portions of the film formed on the MSP by respective ones of the two lithographic tools; and adjusting a grid on each of the two lithographic tools to match the patterned grid on the MSP to produce a respective calibrated version of each of the two lithographic tools, thereby producing a set of calibration data for each of the two lithographic tools for compensating for respective ones of the measured overlay errors.

In various embodiments, the disclosed subject-matter is a method for calibrating a lithographic tool, the method including: placing a metrology-standard panel (MSP) in the lithographic tool; mapping locations of patterned holes in the MSP to locations as determined by the lithographic tool to produce a set of locational data; and determining an overlay correction based on the set of locational data, the overlay correction being a difference between the locations of each of the patterned holes and the locations of each of the patterned holes, respectively, as determined by the lithographic tool.

In various embodiments, the disclosed subject-matter is a a system to calibrate two in-line lithographic tools. The system includes a metrology-standard panel (MSP) configured to be placed subsequently into each of the two in-line lithographic tools. The MSP having an array of patterned holes, with each of the patterned holes being formed to traverse a thickness of the MSP from a first side of the MSP to a second side of the MSP. A measurement tool is configured to measure an overlay error between subsequently exposed features on the MSP and an actual location of respective ones of at least a portion of the patterned holes in the array. Each of the two in-line lithographic tools is configured to map locations of the array of patterned holes in the MSP to locations as determined by a first of the two in-line lithographic tools and a second of the two in-line lithographic tools, respectively, to produce a first set of locational data and a second set of locational data.

BRIEF DESCRIPTION OF FIGURES

Various ones of the appended drawings merely illustrate example implementations of the present disclosure and should not be considered as limiting its scope.

FIG. 4 shows an example of a method for verifying a calibration level of the two lithographic tools of FIG. 1, in accordance with various embodiments of the disclosed subject-matter.

DETAILED DESCRIPTION

The disclosed subject-matter is directed to an apparatus to calibrate lithography equipment. The lithography equipment can be lithographic tools (e.g., including photolithographic steppers (steppers) or scanners) used as part of in-line, panel-production equipment. One example is when the lithography equipment is located in-line and there are two exposure tools are used to expose opposing sides of a substrate. Exposing generally refers to altering the chemistry of a material on a substrate. The exposing can be accomplished using a light with certain wavelengths or a laser depending on the lithography tool. The substrate can be, for example, an Advanced Integrated Circuit Substrates (AICS) panel or another type of panel or substrate, such as a glass or copper-clad laminate (CCL) panel. The panel may be, for example, a flat-panel display or another substrate type.

Consequently, the first lithographic tool patterns a first side of the panel (e.g., the "A" side or front side of the panel). The second lithographic tool patterns an opposite second side (the "B" side or back side of the panel). Therefore, the first exposure tool patterns side "A" of the panel and the second exposure tool patterns the opposing side, side "B" of the panel.

Since the two lithographic tools are set to expose opposing sides of the substrate, there is disclosed herein a calibration standard and a related method to calibrate the two tools with reference to each other such that they expose opposing sides in the same relative positions, or substantially the same positions (e.g., within a lateral-spatial distance of, for example, ±1 microns on the face of the panel—however, this lateral-spatial distance is constantly decreasing), from a first side to a second side of the panel. The calibration standard is alternatively referred to as a metrology-standard panel (MSP) herein.

In various embodiments, the MSP described herein has a thickness substantially equivalent to a standard-production panel (e.g., the AICS panel), and is patterned with holes formed therethrough. As described in more detail below, in various embodiments the holes may be laser-drilled holes or holes of the pattern formed from a first side of the MSP to an opposing side of the panel. Consequently, the holes are completely formed through the MSP such that the pattern on a first side (e.g., side "A") of the MSP is substantially in the same spatial location, with regard to a face of the first side, as is the pattern found on a second side (e.g., on side "B") of the MSP. Thus, the holes of the pattern are substantially in alignment with each other from the first face to the second face.

As used herein, a person of ordinary skill in the art will recognize that other lithographic tools, such as steppers and direct-write lithography tools, can also benefit from the disclosed subject-matter. Therefore, the term "litho tool" may be used herein simply for brevity to cover all types of lithographic tools.

Figure 1:
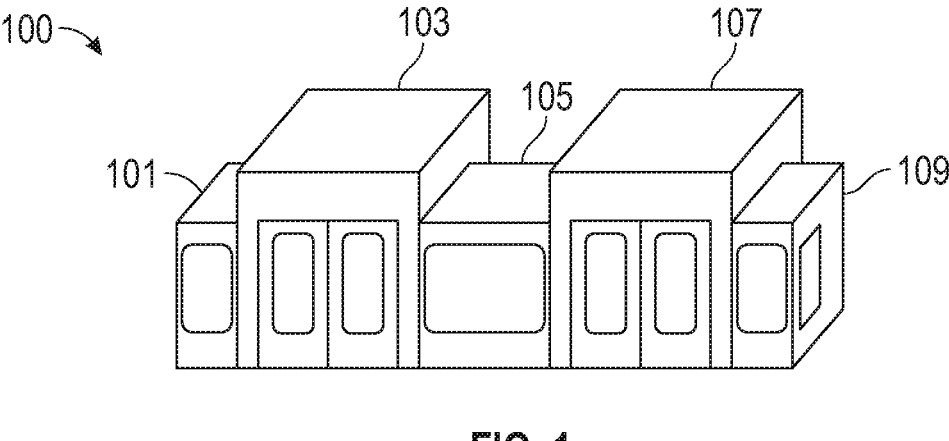
FIG. 1 shows an example of in-line production equipment used to expose opposing sides of a two-sided substrate, such as, for example, an Advanced Integrated Circuit Substrates (AICS) panel or another type of panel, such as a copper-clad laminate (CCL) panel. The in-line production equipment includes two lithographic tools with a flipper unit located between the two tools; the two tools in the production line can be calibrated to each other using various embodiments of the disclosed subject-matter.

With reference now to FIG. 1, FIG. 1 is shown to include an example of in-line production equipment 100 used to expose opposing sides of a two-sided substrate (the substrate is not shown in FIG. 1 but described in detail below with reference to FIGS. 2A and 2B), such as, for example, an Advanced Integrated Circuit Substrates (AICS) panel or another type of panel, such as a copper-clad laminate (CCL) panel. The in-line production equipment 100 includes a first lithographic tool 103 and a second lithographic tool 107 on opposite ends of the in-line production equipment 100.

A flipper unit 105 is an interface tool that is located between the two lithographic tools 103, 107. The flipper unit 105 is arranged to flip the panel from the first side facing (e.g., in an up direction) to receive an exposure from the first lithographic tool 103 to the second side facing (e.g., in an up direction after being flipped) to receive an exposure from the second lithographic tool 107. A loader unit 101 is used to prepare panels for transport into the first lithographic tool 103 such that the panel may be exposed on the first side of the panel. An unloader unit 109 is used to receive panels from the second lithographic tool 107 after the panel has been exposed on the second side.

Since the two lithographic tools 103, 107 are set to expose opposing sides of the panel, there is disclosed herein a calibration standard and a related method to calibrate the two tools with reference to each other such that they expose the opposing sides of a panel in the same relative positions, or substantially the same positions, from the first side to the second side of the panel.

In various embodiments, the same relative positions, or substantially the same positions, may be considered to be, for example, within a lateral-spatial distance of ±0.5 microns on the face of the panel. In embodiments, the same relative positions, or substantially the same positions, may be considered to be, for example, within a lateral-spatial distance of ±2 microns on the face of the panel. In embodiments, the same relative positions, or substantially the same positions, may be considered to be, for example, within a lateral-spatial distance of ±1 micron on the face of the panel. These spatial dimensions are provided as examples only. A person of ordinary skill in the art, upon reading and understanding the disclosed subject matter, will understand that the lateral-spatial distance may change depending upon the spatial requirements and design rules of a given generation of production panel being produced.

The two lithographic tools 103, 107 of the in-line production equipment 100 can be calibrated to each other to at least the lateral-spatial distances shown above using various embodiments of the disclosed subject-matter.

As discussed above, the flipper unit 105 is an interface tool located between the two exposure tools 103, 107 and presents each of the first exposure tool 103 and the second exposure tool 107 with the correct side, the "A" side or the "B" side of the panel, as defined by a process flow. In various embodiments, an overlay of the patterns between the front side and the back side of the panel (sides "A" and "B") may meet pre-defined production overlay specifications to enable, for example, "plated-through holes" (PTH) to connect with redistribution-layer (RDL) structures on either side of the panel. In various embodiments, the overlay specifications may be the same as or similar to the lateral-spatial distances described above.

Depending on the type of panel being produced, each side of the panel may have twelve or more layers per side of the substrate, resulting in 24 or more layers total. In one example of an AICS production line, a specification for a total overlay error may be less than 50 μm after the 24 layers are formed. In this example, the total overlay error may be less than 50 μm may be considered as a Front-to-Back Overlay (FTBO) specification. The FTBO specification may be different for different types of standard-production panels being produced.

Figure 2A:
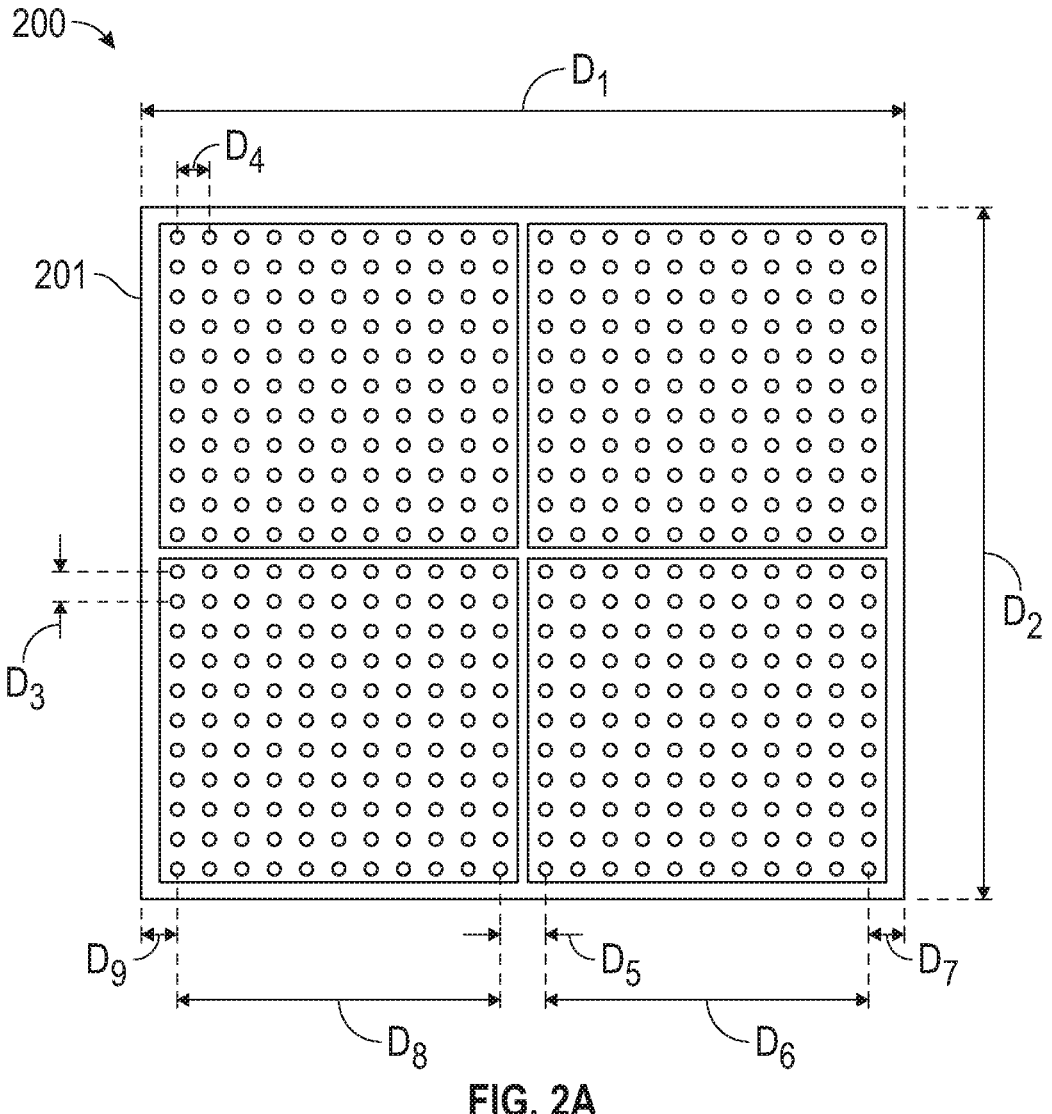
FIG. 2A shows an example of a substrate upon which various patterns and features can be exposed by the in-line production equipment of FIG. 1.

FIG. 2A shows an example of a metrology-standard panel (MSP) 200 upon which various patterns and features can be exposed and measured by the in-line production equipment 100 of FIG. 1. In various embodiments, the MSP 200 may be produced to have a thickness substantially equivalent to a standard-production panel (e.g., the AICS substrate or other type of panel such as a copper-clad laminate (CCL) panel). Depending upon a final application and use of a standard-production panel, the panel may be from, for example, about 100 μm, or less, up to about 3000 μm, or more, in thickness. The MSP 200 is therefore produced with approximately the same thickness as thickness of the standard-production panel being produced by the in-line production equipment 100 of FIG. 1.

In various embodiments, the MSP 200 may have a first dimension, Di, of about 515 mm and a second dimension, De, of about 510 mm. (A person of ordinary skill in the art will recognize that all dimensions provided herein are provided as examples only. For example, panels (e.g., the MSP 200) could be larger or smaller than the exemplary dimensions stated. A face 201 of the MSP 200 may have four quadrants patterned thereon, with each of the quadrants being patterned with holes formed through therethrough. Each quadrant may represent a single exposure field for each of the lithographic tools 103, 107 of FIG. 1. Therefore, in the example of the MSP 200 shown, there would be a total of four exposures per side of the MSP 200. The layout of the patterned holes may be symmetrical about a center point of the MSP 200.

In various embodiments, the holes may be laser-drilled holes or holes formed (e.g., by chemical etching) from a first side of the MSP 200 to an opposing side of the panel. Consequently, the holes are completely formed through the MSP 200 such that the pattern on a first side of the MSP 200 (side "A") is substantially the same as and aligned with the pattern on a second side of the MSP 200 (side "B"). The holes may be referred to as through-glass vias (TGVs) and are, for example, about 100 μm to about 150 μm in diameter. In embodiments, a tolerance on the diameter of the holes may be about ±3 μm with a placement accuracy of about ±5 μm.

In various embodiments, a layout of the patterned holes may be symmetrical about the center of the panel as noted above. The symmetrical layout avoids potential issues with any x- or y-offsets when considering, for example, distances from each edge when the MSP 200 is flipped from the "A" side to the "B" side, as described below with reference to FIGS. 3 and 4, below. However, the symmetrical layout is not required as long as an operation of a metrology or other measurement tool used to perform measurements on the MSP 200 considers the additional offsets from the "A" side to the "B" side if the MSP 200 is not symmetrical and that such offsets are programmed into one or both litho tools, as described below. Furthermore, the patterned holes may be provided in each of, for example, four quadrants of the MSP 200, which may also be symmetrical about the center of each of the four quadrants (exposure fields).

With continuing reference to FIG. 2A, the MSP 200 is shown to include an 11×11 array of holes in each quadrant. However, the 11×11 array may vary and is provided simply as an example to aid the reader in understanding the disclosed subject-matter. A distance, $D_3$, between holes in a first direction may be about 23 mm. A distance, $D_4$, between holes in a second direction may be about 23 mm. However, the distances $D_3$ and $D_4$ do not need to be the same. The distances $D_3$ and $D_4$ therefore define a pitch of the patterned holes.

Distances, $D_7$ and $D_9$, from a centerline of a first hole to an edge of the MSP 200 may be about 20 mm with a centerline-to-centerline distance, $D_5$, between holes on adjacent quadrants being about 15 mm apart. Based on the exemplary distances provided above, a size of each quadrant, based on centerline-to-centerline distance $D_6$ and $D_8$, between outermost holes on each quadrant, is about 230 mm.

Overall, the MSP 200 provides a "golden-panel" reference that, when processed with layers such as, for example, photoresist on each of the two sides (the "A" side and the "B" side) provides a determination as to whether the lithographic tools 103, 107, are capable of meeting a set of pre-determined overlay FTBO-specifications as defined above (e.g., a total-overlay error of less than about 50 μm after 24 layers in total are formed). Upon reading and understanding the disclosed subject-matter, a person of ordinary skill in the art will recognize that the various dimensions provided above are examples only to describe specific exemplary embodiments. Therefore, the dimensions may vary as needed for a particular in-line production line for standard-production panels with various design rules.

As described in more detail below, measured values of offsets may be determined by various types of metrology or other measurement tools, such as optical profilometers, mechanical profilometers, and other measurement tools known in the art. Should a measured value of an offset by found to be outside of the set of pre-determined overlay FTBO-specifications, several adjustments may be used to adjust and thereby calibrate one or both of the lithographic tools 103, 107. Such adjustments to an exposure tool may include, for example, adjustments to one or both of intra-field adjustments (e.g., adjustments affecting calibration within one of the exposure fields) and inter-field adjustments (e.g., adjustments affecting calibration from one or more of the exposure fields to remaining one of the exposure fields). Inter-field adjustments are used to adjust, for example, calibration errors within a litho tool stage. Intra-field adjustments are used to adjust, for example, calibration errors of a litho tool image (lens). In various embodiments, the adjustments to calibrate one or both of the lithographic tools can include, for example, inter-field x-y scaling adjustments, intra-field x-y scaling adjustments, translational adjustments, rotational adjustments, anamorphic magnification adjustments, as well as higher-order adjustment terms (e.g., pincushion and barrel due to projection-lens errors in one or both of the lithographic tools). Any combination of these errors can be entered into, for example, a software-based exposure tool-matching model (e.g., a litho tool-matching model) to reduce or eliminate (e.g., compensate for) overlay errors. As described below, calibration values may be determined and entered into a database located on the litho tool and/or in a remote litho tool-matching database.

Figure 2B:
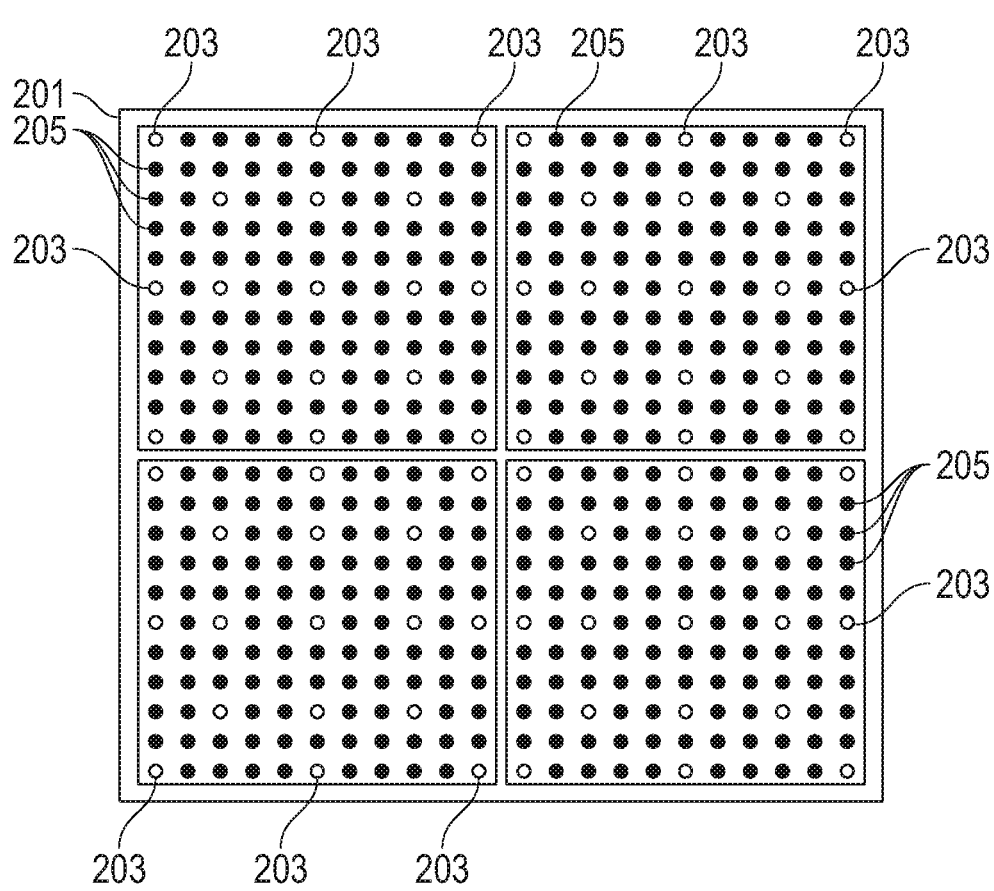
FIG. 2B shows an example of the substrate of FIG. 2A with points (e.g., selected ones of the patterned holes) to be measured by a metrology or other measurement tool, in accordance with various embodiments of the disclosed subject-matter.

FIG. 2B shows an example of the MSP 200 of FIG. 2A with points (e.g., selected ones of the patterned holes) to be measured by a metrology or other measurement tool, in accordance with various embodiments of the disclosed subject-matter. In an exemplary embodiment, a metrology-tool map 210 shows all pattered through-holes 205. Selected ones 203 of the patterned holes on the metrology-tool map 210 indicate which ones the pattered through-holes 205 are to be measured. In this example, there are a total of 17 points to be measured within each quadrant (e.g., 17 points per exposure field). However, the number of points (holes) to be measured is just an example. The number of points can be varied from just a few points to each of the 121 points in each 11×11 array. The measurements of the points and their application to the calibration of the lithographic tools 103, 107 are described in more detail with reference to FIGS. 3 and 4, below.

In various embodiments, the disclosed subject-matter is therefore a calibration standard and related method to perform a calibration of the first lithographic tool 103 to the second lithographic tool 107 for an FTBO determination and calibration of each of the lithographic tools 103, 107. In an exemplary embodiment, a test method can proceed as described by the operations given below with reference to FIGS. 3 and 4.

Figure 3:
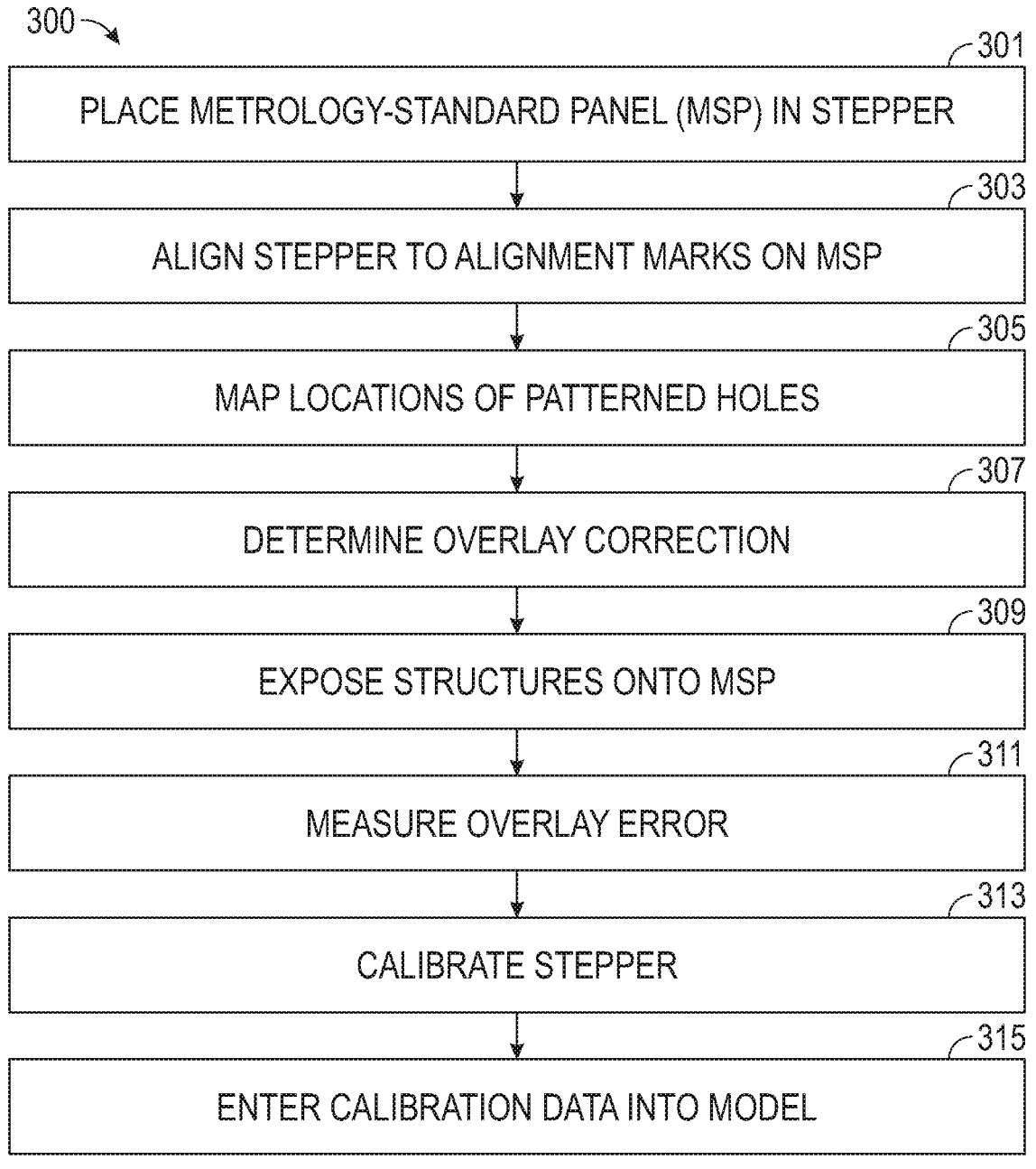
FIG. 3 shows an example of a method for calibrating a first lithographic tool to a second lithographic tool of FIG. 1, one to the other, in accordance with various embodiments of the disclosed subject-matter.

FIG. 3 shows an example of a method 300 for calibrating a first lithographic tool (e.g., the first lithographic tool 103 of FIG. 1) to a second lithographic tool (e.g., the second lithographic tool 107 of FIG. 1), one to the other, in accordance with various embodiments of the disclosed subject-matter.

At operation 301, a metrology-standard panel (MSP, such as the MSP 200 of FIG. 2A) is placed in a first lithographic tool (e.g., a first litho tool). Global alignment targets on side "A" of the MSP are aligned in the first litho tool at operation 303. At operation 305, locations of the patterned holes of the MSP are mapped to locations as determined by the first litho tool. The locational data (e.g., in a software-based litho tool-match program) is used to determine overlay corrections, if any, of the actual hole locations (e.g., planned locations of the holes) to the locations determined by the first litho tool, and is compared at operation 307 to determine an overlay correction, if any.

At operation 309, structures (e.g., which may correspond to RDL structures such as pads) corresponding to the hole locations in the MSP are exposed by the first litho tool onto the MSP. The structures may be exposed (e.g., printed) onto a suitable film, for example, a photoresist layer formed on the "A" side of the MSP. In embodiments, the photoresist layer may be a dry-film photoresist (e.g., a DFR), However, a suitable film can be any film that, when exposed to a light source, such as an ultraviolet (UV) or deep-ultraviolet (DUV) source within the litho tool, the exposed area hardens to form an area resistant to subsequently applied etching solutions.

At operation 311, a resulting overlay error, if any, is measured using a suitable metrology or other measurement tool (e.g., such as an optical profilometer or mechanical profilometer) or other type of 2D-metrology technology known in the art.

At operation 313, a grid on the first litho tool is adjusted to match the patterned grid on the MSP to produce a calibrated version of the first litho tool based on the measured-overlay error. A few types of adjustments that are adjusted on the first litho tool are described above and are known to a person of ordinary skill in the art. The calibration data, based on the adjustments from operation 313, may then be entered into a calibration model for the first litho tool at operation 315. The calibration data may be saved into a database either within the litho tool itself and/or in a database external to the litho tool).

The steps from operations 301 through 315, above, may then be performed for a second lithographic tool (e.g., a second litho tool) on side "B" of the MSP. One or more of the operations described above may communicate over one or more networks as described, for example, with reference to FIG. 5, below.

FIG. 4 shows an example of a method 400 for verifying a calibration level of the two lithographic tools (e.g., the first lithographic tool 103 and the second lithographic tool 107; such as lithographic steppers) of FIG. 1, in accordance with various embodiments of the disclosed subject-matter.

At operation 401, locational data for each of the two litho tools is modeled into litho tool-control software. This modeling step may the same as or similar to the calibration operations 301 through 315 as described above with reference to FIG. 3. The modeled data are then retrieved from a storage area (e.g., within each litho tool or from a database external to one or both litho tools) and applied to respective ones of the first litho tool and the second litho tool at operation 403.

Structures are then exposed (e.g., printed) on a first side ("A" side) of the MSP (e.g., which is similar to or the same as the MSP 200 of FIG. 2A) with the first litho tool at operation 405.

After the MSP is exposed by the first litho tool at operation 405, the MSP is flipped at operation 407 such that the second side (side "B") is now facing in a direction (e.g., up) such that the second side is now in a position to be exposed by the second litho tool. The MSP may be flipped by, for example, a flipper unit, such as the flipper unit 105 of FIG. 1.

Structures are then exposed (e.g., printed) by the second litho tool on the second side (the "B" side) of the MSP at operation 409. At operation 411, the first side and the second side of the MSP are developed to reveal the exposed areas on the MSP based on the exposure (printing) operations of the first litho tool and the second litho tool on respective sides of the MSP.

At operation 413, an overlay error, if any, is measured and compared to a planned location of the exposed structure on the first side of the MSP. This measurement operation may the same as or similar to the measurement of overlay errors performed at operation 311 of FIG. 3.

In the same or similar manner, At operation 415, an overlay error, if any, is measured and compared to a planned location of the exposed structure on the second side of the MSP. This measurement operation may also be the same as or similar to the measurement of overlay errors performed at operation 311 of FIG. 3 when performed the second time on the second side of the MSP.

A determination is made at operation 417 if the measured results and comparisons meet a pre-determined specification or specifications, such as the FTBO specification described above. For example, if a specification for a total overlay error is pre-defined to be less than 50 μm after the 24 layers (12 layers per side) are formed, a single layer overlay error may be one-twelfth the value or 50 μm divided by 12, or no more than about 4.2 μm per layer per side. These FTBO overlay errors are provided as an example only and may vary depending upon a given process and design ruled for a given standard-production panel.

If a determination is made at operation 417 that at least one of the litho tools does not meet the pre-determined specification, then one or both of the litho tools are recalibrated as operation 419. The recalibration of the litho tool or litho tools may be performed as described with reference to FIG. 3, above. If a determination is made at operation 417 that the litho tools do meet the pre-determined specification, then the method 400 is completed at operation 421. One or more of the operations described above may communicate over one or more networks as described, for example, with reference to FIG. 5, below.

Although not described in detail, either method 300 for calibrating a lithographic tool or the method 400 of verifying a calibration of the two lithographic tools, the MSP used in either method may be reworked and reused. The rework of the MSP involves, for example, stripping any former films and recoating the MSP on both sides with a suitable film (e.g., a dry-film resist (DFR) as noted above).

The MSP standard (the "golden-panel" reference as referred to above) and the described methods for the use of the MSP provides a means to calibrate the first litho tool, to the flipper, to the second litho tool to pattern both side "A" and side "B" with the now-calibrated first and second litho tools in an in-line exposure process.

Further, although not described in detail, the MSP and the related methods for use of the MSP may be used to calibrate production equipment used to produce, for example, through-glass vias (TGVs). Instead of calibrating a first and second litho tool, the MSP may be used to calibrate the equipment producing the TGVs from a first side of a production panel to the second side of the panel.

Figure 5:
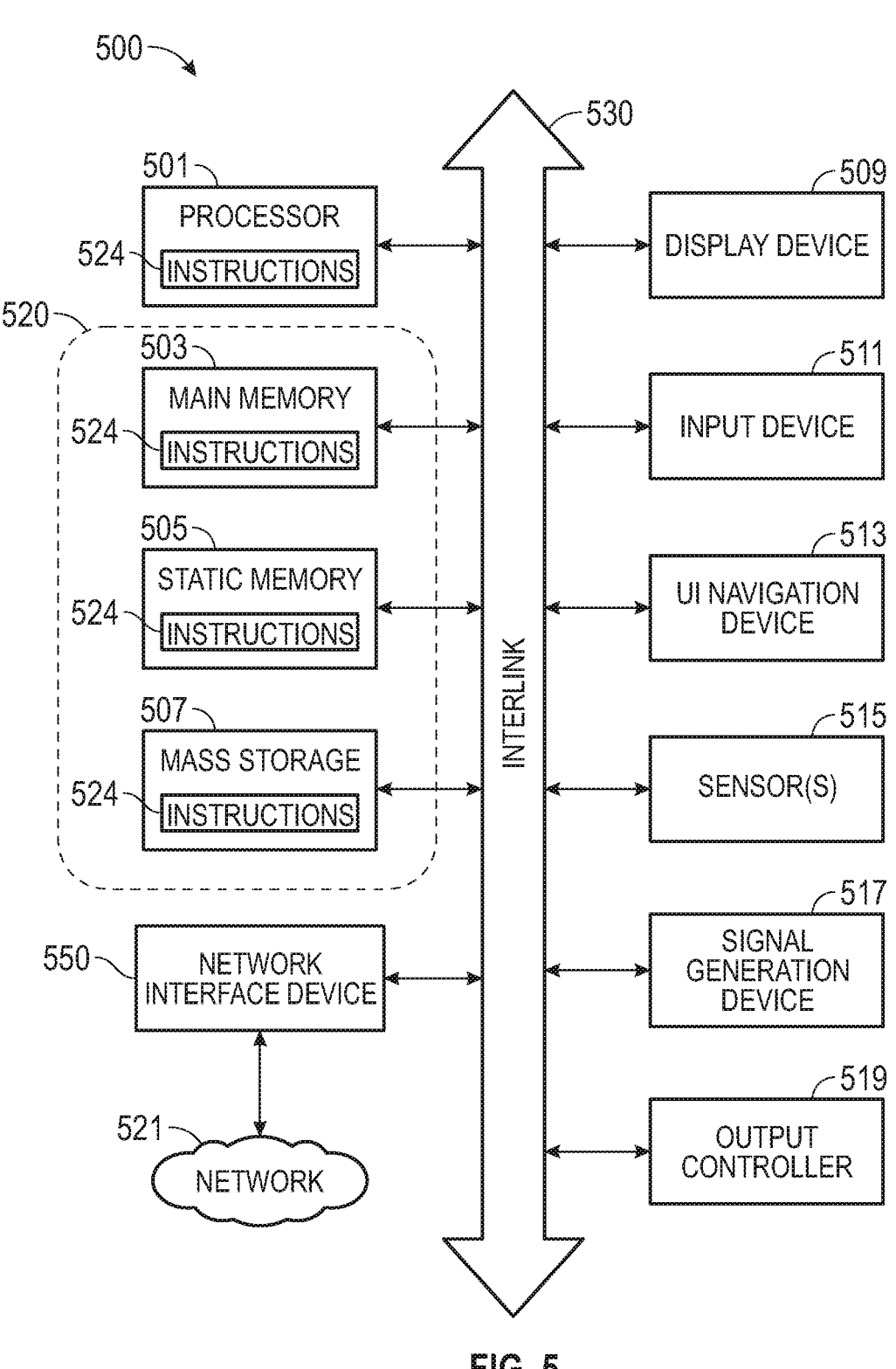
FIG. 5 shows a block diagram of an example comprising a machine upon which any one or more of the techniques (e.g., methodologies, calculations, etc.) discussed herein may be performed.

The methods and techniques shown and described herein can be performed using a portion or an entirety of a machine 500 as discussed below in relation to FIG. 5. FIG. 5 shows an exemplary block diagram comprising a machine 500 upon which any one or more of the techniques (e.g., methodologies, calculations, etc.) discussed herein may be performed. In various examples, the machine 500 may operate as a standalone device or may be connected (e.g., networked) to other machines.

In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet device, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (Saas), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware comprising the circuitry may include variably connected physical components (e.g., execution units, transistors, simple circuits, etc.) including a computer-readable medium physically modified (e.g., magnetically, electrically, such as via a change in physical state or transformation of another physical characteristic, etc.) to encode instructions of the specific operation. In connecting the physical components, the underlying electrical properties of a hardware constituent may be changed, for example, from an insulating characteristic to a conductive characteristic or vice versa. The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine 500 (e.g., computer system) may include a hardware-based processor 501 (e.g., a central processing unit (CPU), a graphics processing unit (GPU), a hardware processor core, or any combination thereof), a main memory 503 and a static memory 505, some or all of which may communicate with each other via an interlink 530 (e.g., a bus). The machine 500 may further include a display device 509, an input device 511 (e.g., an alphanumeric keyboard), and a user interface (UI) navigation device 513 (e.g., a mouse). In an example, the display device 509, the input device 511, and the UI navigation device 513 may comprise at least portions of a touch screen display. The machine 500 may additionally include a storage device 520 (e.g., a drive unit), a signal generation device 517 (e.g., a speaker), a network interface device 550, and one or more sensors 515, such as a global positioning system (GPS) sensor, compass, accelerometer, or other sensor. The machine 500 may include an output controller 519, such as a serial controller or interface (e.g., a universal serial bus (USB)), a parallel controller or interface, or other wired or wireless (e.g., infrared (IR) controllers or interfaces, near field communication (NFC), etc., coupled to communicate or control one or more peripheral devices (e.g., a printer, a card reader, etc.).

The storage device 520 may include a machine-readable medium on which is stored one or more sets of data structures or instructions 524 (e.g., software or firmware) embodying or utilized by any one or more of the techniques or functions described herein. The instructions 524 may also reside, completely or at least partially, within a main memory 503, within a static memory 505, within a mass storage device 507, or within the hardware-based processor 501 during execution thereof by the machine 500. In an example, one or any combination of the hardware-based processor 501, the main memory 503, the static memory 505, or the storage device 520 may constitute machine-readable media.

While the machine-readable medium is considered as a single medium, the term "machine-readable medium" may include a single medium or multiple media (e.g., a centralized or distributed database, and/or associated caches and servers) configured to store the one or more instructions 524.

The term "machine-readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine-readable medium examples may include solid-state memories, and optical and magnetic media. Accordingly, machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic or other phase-change or state-change memory circuits; magnetic disks, such as internal hard disks and removable disks; magneto-optical disks; and CD-ROM and DVD-ROM disks.

The instructions 524 may further be transmitted or received over a communications network 521 using a transmission medium via the network interface device 550 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., the Institute of Electrical and Electronics Engineers (IEEE) 802.22 family of standards known as Wi-Fi®, the IEEE 802.26 family of standards known as WiMax®), the IEEE 802.25.4 family of standards, peer-to-peer (P2P) networks, among others. In an example, the network interface device 550 may include one or more physical jacks (e.g., Ethernet, coaxial, or phone jacks) or one or more antennas to connect to the communications network 521. In an example, the network interface device 550 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

Additionally, examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating.

In an example, hardware or circuitry to control, for example, measurements of the holes in the MSP. Such hardware or circuitry may be designed immutably to carry out a specific operation (e.g., hardwired). In an example, the hardware comprising the circuitry may include variably connected physical components (e.g., execution units, transistors, simple circuits, etc.) including a computer-readable medium physically modified (e.g., magnetically, electrically, such as via a change in physical state or transformation of another physical characteristic, etc.) to encode instructions of the specific operation.

In connecting the physical components, the underlying electrical properties of a hardware constituent may be changed, for example, from an insulating characteristic to a conductive characteristic or vice versa. The instructions enable embedded hardware (e.g., the execution units or a loading mechanism) to create members of the circuitry in hardware via the variable connections to carry out portions of the specific operation when in operation. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Upon reading and understanding the disclosed subject-matter, a person of ordinary skill in the art will recognize that, although the disclosed subject-matter is described in conjunction with lithographic tools and metrology or other measurement tools, no such limitation is intended. The use of the disclosed subject-matter with lithographic tools and/or metrology or other measurement tools is provided to illustrate a possible use of the disclosed subject-matter more readily. Therefore, various aspects of the disclosed subject-matter can be used readily in many different industries.

As used herein, the term "or" may be construed in an inclusive or exclusive sense. Further, other embodiments will be understood by a person of ordinary skill in the art based upon reading and understanding the disclosure provided. Moreover, the person of ordinary skill in the art will readily understand that various combinations of the techniques and examples provided herein may all be applied in various combinations.

Throughout this specification, plural instances may implement components, operations, or structures described as a single instance. Although individual operations are illustrated and described as separate operations, one or more of the individual operations may be performed concurrently, and, unless otherwise stated, nothing requires that the operations necessarily be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter described herein.

Further, although not shown explicitly but understandable to a skilled artisan, each of the various arrangements, quantities, and number of elements may be varied (e.g., the number of pre-load bearings or the number of load stage actuators). Moreover, each of the examples shown and described herein is merely representative of one possible configuration and should not be taken as limiting the scope of the disclosure.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of operations, systems, and processes have been described, these methods, operations, systems, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to ascertain quickly the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The description provided herein includes illustrative examples, devices, and apparatuses that embody various aspects of the matter described in this document. In the description, for purposes of explanation, numerous specific details are set forth in order to provide an understanding of various embodiments of the matter discussed. It will be evident however, to those of ordinary skill in the art, that various embodiments of the disclosed subject-matter may be practiced without these specific details. Further, well-known structures, materials, and techniques have not been shown in detail, so as not to obscure the various illustrated embodiments. As used herein, the terms "about," "approximately," and "substantially" may refer to values that are, for example, within ±10% of a given value or range of values.

THE FOLLOWING NUMBERED EXAMPLES
ARE SPECIFIC EMBODIMENTS OF THE
DISCLOSED SUBJECT-MATTER

Example 1: An embodiment of the disclosed subject-matter describes a method for calibrating two in-line lithographic tools having a substrate flipper unit located therebetween, the method including subsequently placing a metrology-standard panel (MSP) in each of the two lithographic tools; mapping locations of patterned holes of the MSP to locations as determined by a first lithographic tool and a second lithographic tool, respectively, to produce a first set of locational data and a second set of locational data; forming a film on both a first side and a second side of the MSP; exposing portions of the first side of the MSP in the first lithographic tool and the second side of the MSP in the second lithographic tool, respectively; measuring an overlay error for each of the first side and the second side between the patterned holes on the MSP to the exposed portions of the film formed on the MSP by respective ones of the two lithographic tools; and adjusting a grid on each of the two lithographic tools to match the patterned grid on the MSP to produce a respective calibrated version of each of the two lithographic tools, thereby producing a set of calibration data for each of the two lithographic tools for compensating for respective ones of the measured overlay errors.

Example 2: The method of Example 1, wherein the MSP is formed in a glass plate having a thickness about equal to a thickness of a flat-panel display patterned by the two in-line lithographic tools.

Example 3: The method of any one of the preceding Examples, wherein the MSP is formed to include an array of patterned holes, the patterned holes being formed to traverse a thickness of the MSP from the first side to the second side of the MSP.

Example 4: The method of Example 3, wherein the patterned holes of the MSP are aligned from the first side to the second side within ±1 microns.

Example 5: The method of any one of the preceding Examples, further including: aligning the first lithographic tool to global alignment targets on the first side of the MSP prior to exposing the MSP on the first side; and aligning the second lithographic tool to global alignment targets on the second side of the MSP prior to exposing the MSP on the second side.

Example 6: The method of any one of the preceding Examples, further including calibrating at least one of the first lithographic tool and the second lithographic tool for at least one of inter-field x-y scaling adjustment and intra-field x-y scaling adjustment.

Example 7: The method of any one of the preceding Examples, further including entering each of the sets of the calibration data into a software-based litho tool-matching model to compensate for overlay errors in respective ones of the two lithographic tools.

Example 8: The method of any one of the preceding Examples, for each of the two lithographic tools, further including modeling each set of the locational data to determine overlay correction data, respectively, of actual hole locations in the MSP to the locations determined by each of the first lithographic tool and the second lithographic tool.

Example 9: The method of Example 8, further including: applying the modeled sets of the overlay correction, respectively, to the first lithographic tool and the second lithographic tool; exposing a structure onto a first film on the first side of the MSP on the first lithographic tool; flipping the MSP; exposing a structure onto a second film on the second side of the MSP on the second lithographic tool; and developing the first film and the second film on each side of the MSP.

Example 10: The method of Example 9, further including: measuring an overlay error between the developed structures on the first side of the MSP to a planned location of the exposed structure on the first side of the MSP; and measuring an overlay error between the developed structures on the second side of the MSP to a planned location of the exposed structure on the second side of the MSP, the measuring of the overlay error on each side of the MSP for determining whether a final version of measured results of the overlay error meet pre-determined specifications.

Example 11: An embodiment of the disclosed subject-matter describes a method for calibrating a lithographic tool, the method including: placing a metrology-standard panel (MSP) in the lithographic tool; mapping locations of patterned holes in the MSP to locations as determined by the lithographic tool to produce a set of locational data; and determining an overlay correction based on the set of locational data, the overlay correction being a difference between the locations of each of the patterned holes and the locations of each of the patterned holes, respectively, as determined by the lithographic tool.

Example 12: The method of Example 11, further including: forming a film on at least one side of the MSP; exposing a plurality of structures onto the film on the MSP, locations of the plurality of structures corresponding to at least some of the locations of the patterned holes in the MSP; and measuring an overlay error as a difference between each of the patterned holes on the MSP to a respective one of the exposed plurality of structures on the film formed on the MSP.

Example 13: The method of Example 12, further including: producing a calibrated version of the lithographic tool based on applying the measured overlay error; and producing a set of calibration data for the lithographic tool for compensating for respective ones of the measured overlay errors.

Example 14: The method of Example 12, wherein the producing of the calibrated version of the lithographic tool includes entering the set of calibration data into a model to include adjustments of at least one of an inter-field x-y scaling adjustment and an intra-field x-y scaling adjustment.

Example 15: The method of Example 12, wherein the measuring of the overlay error includes using a measurement tool to provide the measurements.

Example 16: The method of any one of Example 11 through Example 15, further including aligning the lithographic tool to alignment marks on the MSP prior to mapping the locations of the patterned holes.

Example 17: The method of any one of Example 11 through Example 16, wherein the locations of the patterned holes of the MSP are based on planned locations of the patterned holes.

Example 18: An embodiment of the disclosed subject-matter describes a system to calibrate two in-line lithographic tools. The system includes a metrology-standard panel (MSP) configured to be placed subsequently into each of the two in-line lithographic tools. The MSP having an array of patterned holes, with each of the patterned holes being formed to traverse a thickness of the MSP from a first side of the MSP to a second side of the MSP. A measurement tool is configured to measure an overlay error between subsequently exposed features on the MSP and an actual location of respective ones of at least a portion of the patterned holes in the array. Each of the two in-line lithographic tools is configured to map locations of the array of patterned holes in the MSP to locations as determined by a first of the two in-line lithographic tools and a second of the two in-line lithographic tools, respectively, to produce a first set of locational data and a second set of locational data.

Example 19: The system of Example 18, wherein a first of the two in-line lithographic tools is configured to expose a first film formed on the first side of the MSP; a second of the two in-line lithographic tools is configured to expose a second film formed on the second side of the MSP; the measurement tool being configured to measure the overlay error for each of the first side and the second side between the patterned holes on the MSP to the exposed portions of the film formed on the MSP by respective ones of the two in-line lithographic tools; and each of the two in-line lithographic tools being configured to adjust a respective grid to match a patterned grid on the MSP to produce a respective calibrated version of each of the two in-line lithographic tools, and produce a first set of calibration data and a second set of calibration data for each of the two lithographic tools, respectively, to compensate for respective ones of the measured overlay errors.

Example 20: The system of Example 19, wherein, for each of the two in-line lithographic tools, each set of the locational data is to be modeled to determine a set overlay correction data, respectively, of actual hole locations in the MSP to the locations determined by each of the first of the two in-line lithographic tools and the second of the two in-line lithographic tools.

What is claimed:

1. A method for calibrating two in-line lithographic tools having a substrate flipper unit located therebetween, the method comprising:
    subsequently placing a metrology-standard panel (MSP) in each of the two lithographic tools;
    mapping locations of patterned holes of the MSP to locations as determined by a first lithographic tool and a second lithographic tool, respectively, to produce a first set of locational data and a second set of locational data;
    forming a film on both a first side and a second side of the MSP;
    exposing portions of the first side of the MSP in the first lithographic tool and the second side of the MSP in the second lithographic tool, respectively;
    measuring an overlay error for each of the first side and the second side between the patterned holes on the MSP to the exposed portions of the film formed on the MSP by respective ones of the two lithographic tools; and
    adjusting a grid on each of the two lithographic tools to match the patterned grid on the MSP to produce a respective calibrated version of each of the two lithographic tools, thereby producing a set of calibration data for each of the two lithographic tools for compensating for respective ones of the measured overlay errors.

2. The method of claim 1, wherein the MSP is formed in a glass plate having a thickness equal to about 100 μm to about 3000 μm.

3. The method of claim 1, wherein the MSP is formed to include an array of patterned holes, the patterned holes being formed to traverse a thickness of the MSP from the first side to the second side of the MSP.

4. The method of claim 3, wherein the patterned holes of the MSP are aligned from the first side to the second side within ±1 microns.

5. The method of claim 1, further comprising:
    aligning the first lithographic tool to global alignment targets on the first side of the MSP prior to exposing the MSP on the first side; and
    aligning the second lithographic tool to global alignment targets on the second side of the MSP prior to exposing the MSP on the second side.

6. The method of claim 1, further comprising calibrating at least one of the first lithographic tool and the second lithographic tool for at least one of inter-field x-y scaling adjustment and intra-field x-y scaling adjustment.

7. The method of claim 1, further comprising entering each of the sets of the calibration data into a software-based litho tool-matching model to compensate for overlay errors in respective ones of the two lithographic tools.

8. The method of claim 1, for each of the two lithographic tools, further comprising modeling each set of the locational data to determine overlay correction data, respectively, of actual hole locations in the MSP to the locations determined by each of the first lithographic tool and the second lithographic tool.

9. The method of claim 8, further comprising:
    applying the modeled sets of the overlay correction, respectively, to the first lithographic tool and the second lithographic tool;
    exposing a structure onto a first film on the first side of the MSP on the first lithographic tool;
    flipping the MSP;
    exposing a structure onto a second film on the second side of the MSP on the second lithographic tool; and
    developing the first film and the second film on each side of the MSP.

10. The method of claim 9, further comprising:
    measuring an overlay error between the developed structures on the first side of the MSP to a planned location of the exposed structure on the first side of the MSP; and
    measuring an overlay error between the developed structures on the second side of the MSP to a planned location of the exposed structure on the second side of the MSP, the measuring of the overlay error on each side of the MSP for determining whether a final version of measured results of the overlay error meet predetermined specifications.

11. A method for calibrating two tools, the method comprising:
    placing a metrology-standard panel (MSP) in a first tool;
    mapping locations of patterned holes in the MSP to locations on a first side of the MSP as determined by the first tool to produce a first set of locational data;

placing the MSP in a second tool;

mapping locations of patterned holes in the MSP to locations on a second side of the MSP as determined by the second tool to produce a second set of locational data;

determining an overlay correction based on the first and second set of locational data, the overlay correction being a difference between the locations of each of the patterned holes and the locations of each of the patterned holes, respectively, as determined by the first and second tools; and adjusting a grid on each of the tools based on the overlay correction, thereby producing a set of calibration data for each of the two tools for compensating for respective overlay errors.

12. The method of claim 11, further comprising:

forming a film on at least one side of the MSP;

exposing a plurality of structures onto the film on the MSP, locations of the plurality of structures corresponding to at least some of the locations of the patterned holes in the MSP; and measuring an overlay error as a difference between each of the patterned holes on the MSP to a respective one of the exposed plurality of structures on the film formed on the MSP.

13. The method of claim 12, further comprising:

producing calibrated versions of the first tool and second tool based on applying the measured overlay error; and producing a set of calibration data for the first tool and second tool, respectively, for compensating for respective ones of the measured overlay errors.

14. The method of claim 12, wherein the producing of the calibrated versions of the first tool and second tool includes entering the set of calibration data into a model to include adjustments of at least one of an inter-field x-y scaling adjustment and an intra-field x-y scaling adjustment.

15. The method of claim 12, wherein the measuring of the overlay error includes using a measurement tool to provide the measurements.

16. The method of claim 11, further comprising aligning the first tool and second tool to alignment marks on the MSP, respectively, prior to mapping the locations of the patterned holes.

17. The method of claim 11, wherein the locations of the patterned holes of the MSP are based on planned locations of the patterned holes.

18. A system to calibrate two in-line lithographic tools, the system comprising:

a metrology-standard panel (MSP) configured to be placed subsequently into each of the two in-line lithographic tools, the MSP having an array of patterned holes, each of the patterned holes being formed to traverse a thickness of the MSP from a first side of the MSP to a second side of the MSP;

a measurement tool configured to measure an overlay error between subsequently exposed features on the MSP and an actual location of respective ones of at least a portion of the patterned holes in the array;

one or more processors; and a memory storing instructions that, when executed by the one or processors, cause the one or more processors to perform operations comprising:

mapping locations of the array of patterned holes in the MSP to locations as determined by a first of the two in-line lithographic tools and a second of the two in-line lithographic tools, respectively, to produce a first set of locational data and a second set of locational data.

19. The system of claim 18, wherein a first of the two in-line lithographic tools is configured to expose a first film formed on the first side of the MSP;

a second of the two in-line lithographic tools is configured to expose a second film formed on the second side of the MSP;

the measurement tool being configured to measure the overlay error for each of the first side and the second side between the patterned holes on the MSP to the exposed portions of the film formed on the MSP by respective ones of the two in-line lithographic tools;

wherein the operations further comprise: adjusting a respective grid to match a patterned grid on the MSP to produce a respective calibrated version of each of the two in-line lithographic tools, and producing a first set of calibration data and a second set of calibration data for each of the two lithographic tools, respectively, to compensate for respective ones of the measured overlay errors.

20. The system of claim 19, wherein, for each of the two in-line lithographic tools, each set of the locational data is to be modeled to determine a set overlay correction data, respectively, of actual hole locations in the MSP to the locations determined by each of the first of the two in-line lithographic tools and the second of the two in-line lithographic tools.

* * * * *